(12) United States Patent
Kim et al.

(10) Patent No.: US 11,302,861 B2
(45) Date of Patent: Apr. 12, 2022

(54) HYBRID ACTUATOR HAVING A FLEXIBLE PRINTED CIRCUIT BOARD FOR APPLYING AN ELECTRIC CURRENT TO A PIEZOELECTRIC ELEMENT AND A COIL INSIDE A HOUSING OF THE HYBRID ACTUATOR

(71) Applicant: EM-TECH. Co., Ltd., Changwon-si (KR)

(72) Inventors: Cheon Myeong Kim, Gyeongsangnam-do (KR); Ji Young Lee, Gyeongsangnam-do (KR); Byung Ho Jung, Gyeongsangnam-do (KR)

(73) Assignee: EM-TECH. CO., LTD., Changwon-si (KR)

( * ) Notice: Subject to any disclaimer, the term of this patent is extended or adjusted under 35 U.S.C. 154(b) by 569 days.

(21) Appl. No.: 16/394,170

(22) Filed: Apr. 25, 2019

(65) Prior Publication Data

US 2019/0334076 A1   Oct. 31, 2019

(30) Foreign Application Priority Data

Apr. 25, 2018   (KR) .................... 10-2018-0047989

(51) Int. Cl.
*H01L 41/08*   (2006.01)
*H01L 41/09*   (2006.01)
(Continued)

(52) U.S. Cl.
CPC ...... *H01L 41/0825* (2013.01); *H01L 41/0913* (2013.01); *H02N 2/0095* (2013.01);
(Continued)

(58) Field of Classification Search
CPC ............ H01L 41/0825; H01L 41/0913; H02N 2/0095; H02N 2/021; H02N 2/028;
(Continued)

(56) References Cited

U.S. PATENT DOCUMENTS

| 2018/0279968 A1* | 10/2018 | Boyd | .................. | H04R 1/46 |
| 2019/0131045 A1* | 5/2019 | Nam | .................. | B06B 1/045 |

FOREIGN PATENT DOCUMENTS

| AU | 2015261458 A1 | 12/2016 |
| CN | 206250943 U | 6/2017 |

(Continued)

*Primary Examiner* — Emily P Pham
(74) *Attorney, Agent, or Firm* — Murphy, Bilak & Homiller, PLLC

(57) ABSTRACT

A hybrid actuator is provided in which a piezoelectric element and an actuator are incorporated with each other. The hybrid actuator includes: a housing; a stator secured to the housing and having a coil; a vibrator having a permanent magnet configured to vibrate due to a mutual electromagnetic force with the stator; an elastic member configured to elastically support the vibrator relative to the housing; a piezoelectric element attached to one surface of the housing; and an F-PCB (flexible printed circuit board) applying an electric current to the piezoelectric element and the coil inside the housing. A part of the F-PCB extends outside the housing. Input terminals are formed on the part of the F-PCB which extends outside the housing. The input terminals are configured to receive a vibration signal and an audio signal so that the hybrid actuator can reproduce both the vibration signal and the audio signal.

11 Claims, 5 Drawing Sheets

(51) Int. Cl.
    *H02N 2/02*         (2006.01)
    *H02N 2/00*         (2006.01)
    *B06B 1/06*         (2006.01)

(52) U.S. Cl.
    CPC ............. *H02N 2/021* (2013.01); *H02N 2/028* (2013.01); *B06B 1/06* (2013.01)

(58) Field of Classification Search
    CPC ... H04R 1/06; H04R 1/24; H04R 7/04; H04R 7/045; H04R 2499/11; H04R 3/12; H04R 9/027; H04R 11/02; H04R 17/00; H04R 23/02; B06B 1/06; B06B 1/0648; B06B 1/045
    See application file for complete search history.

(56) References Cited

FOREIGN PATENT DOCUMENTS

| | | |
|---|---|---|
| JP | 2004104327 A | 4/2004 |
| JP | 2016225857 A | 12/2016 |
| JP | 2016225858 A | 12/2016 |
| KR | 200221515 Y1 | 4/2001 |
| KR | 20150016049 A | 2/2015 |
| KR | 101617661 B1 | 5/2016 |
| KR | 20180010288 A | 1/2018 |

\* cited by examiner

HYBRID ACTUATOR HAVING A FLEXIBLE PRINTED CIRCUIT BOARD FOR APPLYING AN ELECTRIC CURRENT TO A PIEZOELECTRIC ELEMENT AND A COIL INSIDE A HOUSING OF THE HYBRID ACTUATOR

TECHNICAL FIELD

The present invention relates to a hybrid actuator, in which a piezoelectric element and an actuator are incorporated with each other.

BACKGROUND

A flat panel speaker is used in an apparatus such as a mobile phone, a personal digital assistant (PDA) or a personal computer (PC), and it employs, as a diaphragm, a transparent (flat) panel disposed on the surface of the apparatus to cover a display surface of a display device such as a liquid crystal display device.

FIG. 1 shows an example of a conventional flat panel speaker disclosed in Japan Patent Application Publication 2004-104327, wherein a panel 21 equipped with an actuator 10 is disposed on a surface of a mobile phone, with its edges secured to a case 22 of the mobile phone. Here, a gasket 23 is fitted between the edges of the panel 21 and the case 22 on the whole periphery, and the panel 21 is supported on the case 22 through the gasket 23. In FIG. 1, reference numerals 24 and 25 denote a printed circuit board and a lead wire for connecting the actuator 10 to the printed circuit board 24, respectively. Although not illustrated, for example, a liquid crystal display device is mounted on the printed circuit board 24 as a display device.

In the flat panel speaker with the aforementioned construction, an audio signal is input to the actuator 10, which causes a piezoelectric diaphragm 11 and 12 to vibrate, such vibration is transferred to the panel 21 through a holder 13 in the form of waves, and sound is emitted through the entire panel 21. The gasket 23 fitted between the panel 21 and the case 22 serves to decrease the vibration transferred to the case 22 and increase the amount of vibration of the panel 21.

However, the piezoelectric diaphragm sufficiently generates mid- and high-frequency sounds, but is not suitable for generating a low-frequency sound. Moreover, a piezoelectric element can generate a vibration force enough to generate a sound, but cannot provide a vibration force strong enough to allow a vibration function.

SUMMARY

An object of the present invention is to provide a hybrid actuator, in which a piezoelectric element generates mid- and high-frequency sounds and a linear actuator generates a low-frequency sound and a vibration signal.

According to an aspect of the present invention for achieving the above object, there is provided a hybrid actuator, including: a housing for defining the external appearance, a stator secured to the housing and having a coil, a vibrator having a permanent magnet which vibrates due to a mutual electromagnetic force with the stator, an elastic member for elastically supporting the vibrator relative to the housing, a piezoelectric element attached to one surface of the housing, and an F-PCB applying an electric current to the piezoelectric element and the coil inside the housing, part of which being extended to the outside of the housing so that input terminals can be formed thereon to receive a vibration signal and an audio signal, to thereby reproduce both the vibration signal and the audio signal.

In some embodiments, the F-PCB may be disposed between the piezoelectric element and the coil.

In some embodiments, the piezoelectric element may have a hole for use in assembly to the housing.

In some embodiments, the piezoelectric element may have a bimorph structure.

In some embodiments, an electric contact between the piezoelectric element and the F-PCB may be formed further outside the outer diameter of the vibrator.

In some embodiments, the stator may further include a pole piece press-fit and secured to the housing, wherein the coil may be disposed around the pole piece.

In some embodiments, the pole piece may include a first diameter portion press-fit into the housing, a second diameter portion around which the coil is disposed, and a third diameter portion positioned on the coil and having a larger diameter than those of the first diameter portion and the second diameter portion.

In some embodiments, there may be two or more input terminals of the F-PCB, an original signal level being input to the coil and the piezoelectric element or same source signals with different input levels being input to the coil and the piezoelectric element, respectively.

In some embodiments, when reproducing the audio signal, the input level of the vibration signal frequency band may be reproduced equal to or lower than the original signal level.

In some embodiments, the stator may further include a magnetic fluid applied around an air gap.

In some embodiments, the hybrid actuator may further include an elastic member disposed on the top surface of the F-PCB to relieve a touching impact of the vibrator.

In the hybrid actuator and the mobile apparatus having the same according to the present invention, as the linear actuator and the piezoelectric element are incorporated with each other, the linear actuator serves to generate a low-frequency sound and a sensible vibration and the piezoelectric element serves to generate mid- and high-frequency sounds, which makes it possible to overcome disadvantages of the conventional panel speaker using the piezoelectric element.

In addition, the hybrid actuator according to the present invention does not have to include a vibration module and a piezoelectric element separately, which is advantageous in terms of space.

Those skilled in the art will recognize additional features and advantages upon reading the following detailed description, and upon viewing the accompanying drawings.

DETAILED DESCRIPTION

Figure 1:
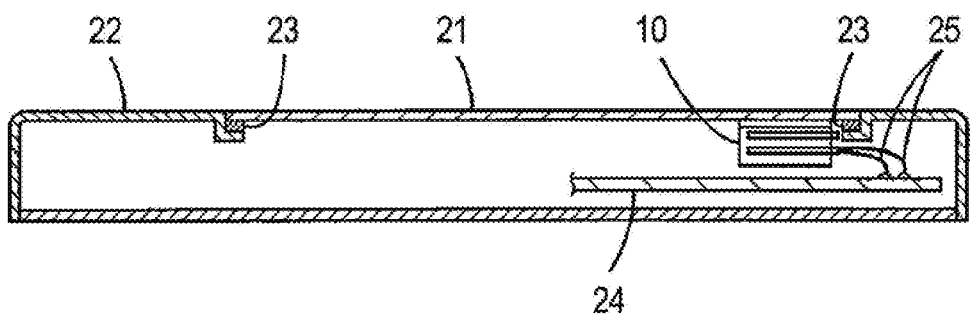
FIG. 1 is a view showing one example of a conventional flat panel speaker having a piezoelectric element.
Figure 2:
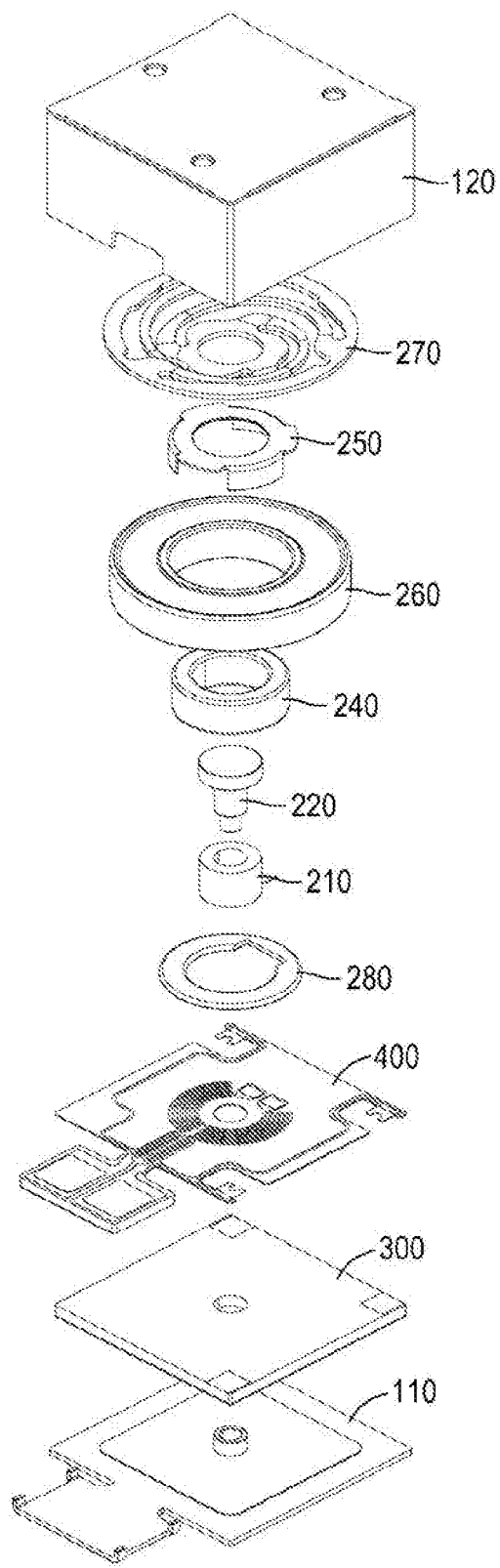
FIG. 2 is an exploded view showing a hybrid actuator according to a first embodiment of the present invention.
Figure 3:
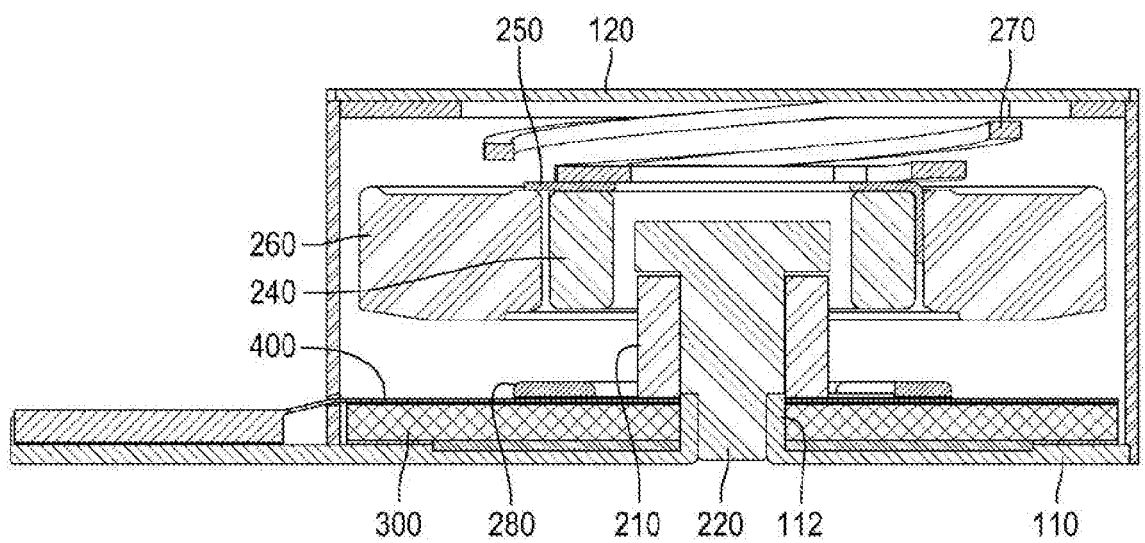
FIG. 3 is a sectional view showing the hybrid actuator according to the first embodiment of the present invention.

FIG. 2 is an exploded view showing a hybrid actuator according to a first embodiment of the present invention, and FIG. 3 is a sectional view showing the hybrid actuator according to the first embodiment of the present invention.

In the hybrid actuator according to the first embodiment of the present invention, components are arranged in a housing formed by coupling a lower housing 110 defining a bottom surface and an upper housing 120 defining top and side surfaces. A wound coil 210 and a pole piece 220 inserted into the center of the coil 210 are coupled to the bottom surface of the lower housing 110.

A vibrator is disposed on the same axis as that of the stator 210 and 220 to vertically vibrate due to a mutual electromagnetic force. The vibrator includes a permanent magnet 240 formed in a ring shape and disposed with an air gap from the stator 210 and 220, a yoke 250 coupled to the top surface of the permanent magnet 240 and partially extended and downwardly bent to surround the outer periphery of the permanent magnet 240, and a weight 260 coupled to the outside of the yoke 250 to enhance a vibration force of the vibrator. In addition, an elastic member 280 for elastically supporting the vibrator may be interposed between the vibrator and the upper housing 120. The elastic member 280 is formed in a circular shape, with the outer periphery secured to the upper housing 120 and the center secured to the vibrator.

Figure 4:
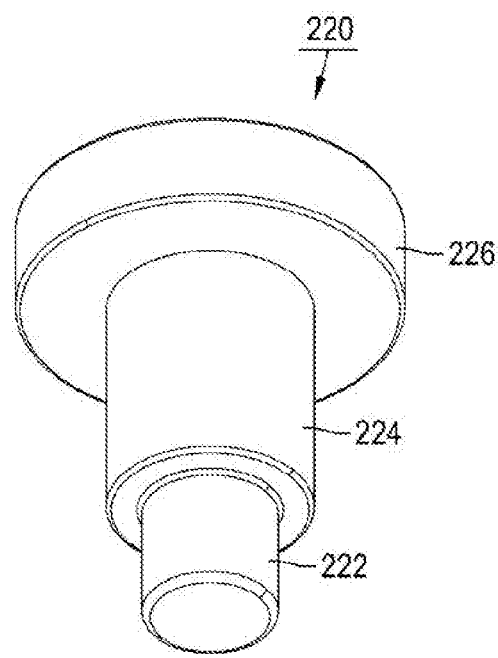
FIG. 4 is a view showing a pole piece provided in the hybrid actuator according to the first embodiment of the present invention.

The lower housing 110 and the upper housing 120 have a quadrangular section, and the stator and the vibrator are formed in a concentric circular shape. An inwardly(upwardly)-projecting boss 112 is provided at the center of the lower housing 110, the lower end of the pole piece 220 being inserted into the boss 112. Referring to FIG. 4, the pole piece 220 includes a first diameter portion 222 press-fit into the boss 112 of the lower housing 110, a second diameter portion 224 around which the coil 210 is disposed, and a third diameter portion 226 positioned on the coil and having a larger diameter than those of the first diameter portion 222 and the second diameter portion 224.

Figure 5:
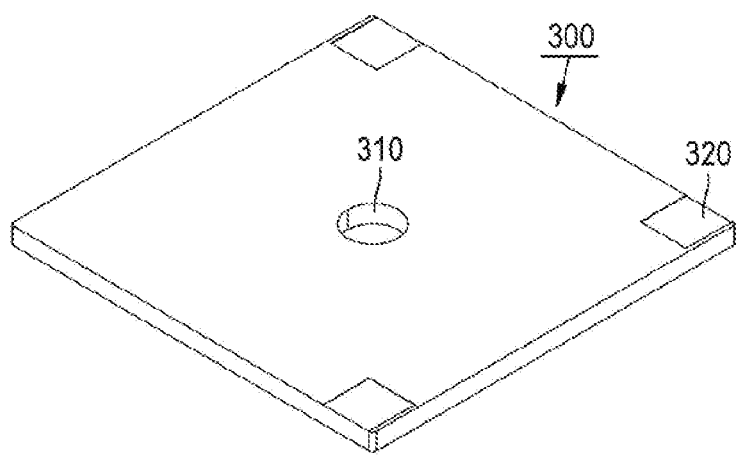
FIG. 5 is a view showing a piezoelectric element provided in the hybrid actuator according to the first embodiment of the present invention.

Meanwhile, a piezoelectric element 300 is formed in a quadrangular shape and arranged on the top surface of the lower housing 110. Referring to FIG. 5, the piezoelectric element 300 has a hole 310 at the center, and the position of the hole 310 corresponds to the position of the boss 112 of the lower housing 110 so that the boss 112 can pass through the hole 310. Further, it is preferable that the piezoelectric element 300 should have a bimorph structure for improving a vibration force, electric contacts 320 capable of transferring an electric signal to the piezoelectric element 300 being provided at three edges thereof. That is, it is preferable that the electric contacts 320 of the piezoelectric element 300 should be formed further outside the outer periphery of the weight 260 having the largest diameter, to avoid the vibrator.

The vibrator can vibrate at a frequency of 50 to 300 Hz, which generates a sensible vibration that can be sensed by a user, and also can vibrate at a frequency of 50 to 10000 Hz, which leads to the vibration of the whole mobile apparatus having the hybrid actuator, which generates a low-frequency sound. In addition, the piezoelectric element can vibrate at a frequency of 300 to 20000 Hz, which leads to the vibration of the whole mobile apparatus having the hybrid actuator, which generates mid- and high-frequency sounds.

Furthermore, an F-PCB (flexible printed circuit board) 400 capable of transferring an electric signal to the coil 210 and the piezoelectric element 300 may be further provided on the lower housing 110. From the lower side, the lower housing 110, the piezoelectric element 300, the F-PCB 400 and the coil 210 are disposed in order. The F-PCB 400 applies an electric current to the piezoelectric element 300 and the coil 210 inside the housing 110 and 120, and part of which extends outside the housing 110 and 120 so that input terminals (see FIGS. 6 and 7) can be formed thereon to receive a vibration signal and an audio signal, as a result of which the hybrid actuator can reproduce both the vibration signal and the audio signal.

In turn, the elastic member 280 fitted around the boss 112 to prevent the F-PCB 400 from being damaged due to a touch of the vibrator may be further provided on the top surface of the F-PCB 400. The elastic member 280 is a ring-shaped member which can prevent the vibrator from directly touching the F-PCB 400 and which can absorb a touching impact of the vibrator by elastic deformation.

Figure 6:
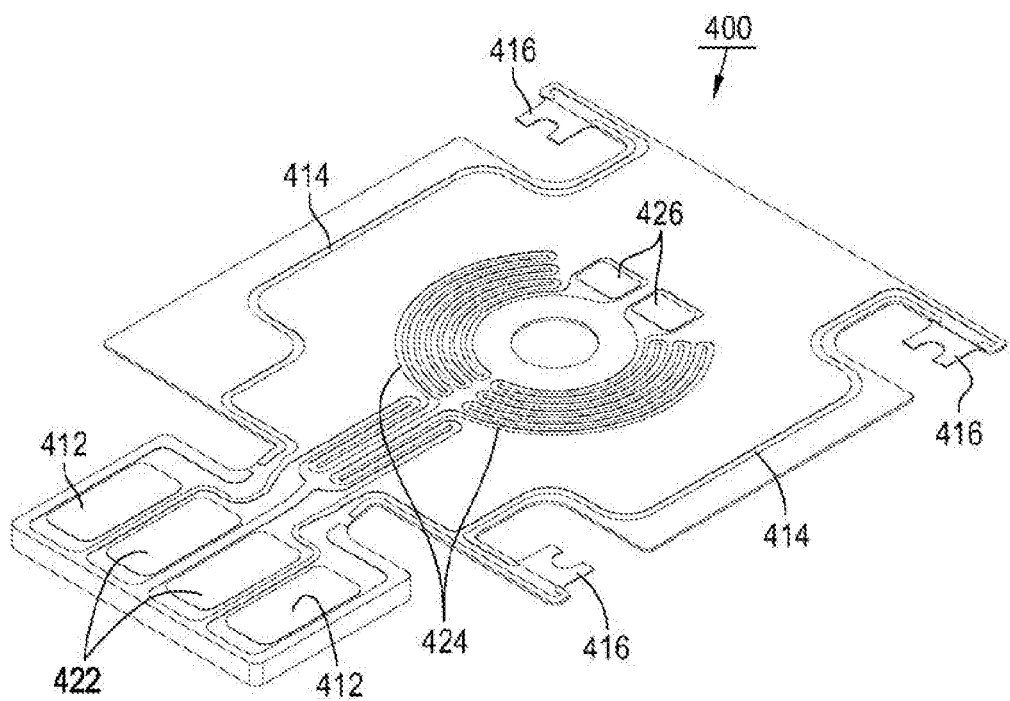
FIG. 6 is a view showing a first example of an F-PCB provided in the hybrid actuator according to one embodiment of the present invention.

FIG. 6 is a view showing a first example of the F-PCB provided in the hybrid actuator according to one embodiment of the present invention. The F-PCB 400 includes a terminal 412 for receiving a source signal with an input level for the piezoelectric element 300 (see FIG. 2), an output terminal 416 connected to the electric contact 320 (see FIG. 4) of the piezoelectric element 300 (see FIG. 2), and a connection pattern 414 for connecting the input terminal 412 to the output terminal 416. In addition, the F-PCB 400 includes a terminal 422 for receiving a source signal with an input level for the coil 210 (see FIG. 2), an output terminal 426 electrically connected to the coil 210 (see FIG. 2), and a connection pattern 424 for connecting the input terminal 422 to the output terminal 426. When reproducing the audio signal, preferably, the input level of the vibration signal frequency band is reproduced equal to or lower than the original signal level.

Figure 7:
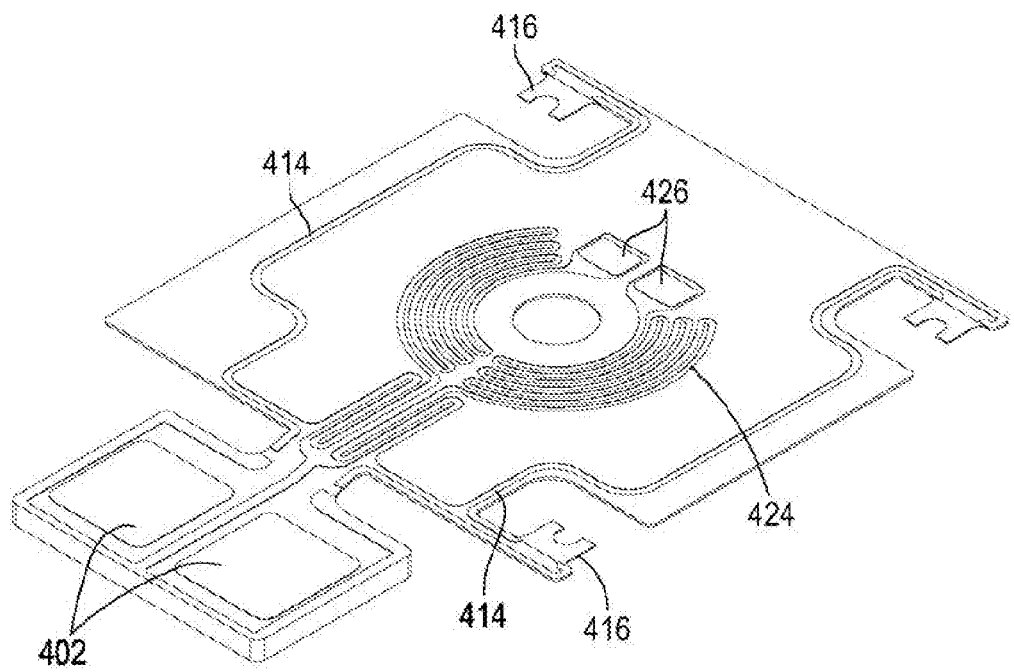
FIG. 7 is a view showing a second example of the F-PCB provided in the hybrid actuator according to one embodiment of the present invention.

FIG. 7 is a view showing a second example of the F-PCB provided in the hybrid actuator according to one embodiment of the present invention. The F-PCB includes only a pair of input terminals 402, an original signal level being input to the coil 210 (see FIG. 2) and the piezoelectric element 300 (see FIG. 2). The F-PCB includes an output terminal 416 electrically connected to the electric contact 320 (see FIG. 4) of the piezoelectric element 300 (see FIG. 2), an output terminal 426 electrically connected to the coil 210 (see FIG. 2), and connection patterns 414 and 424 for connecting the input terminal 402 to the respective output terminals 416 and 426.

Figure 8:
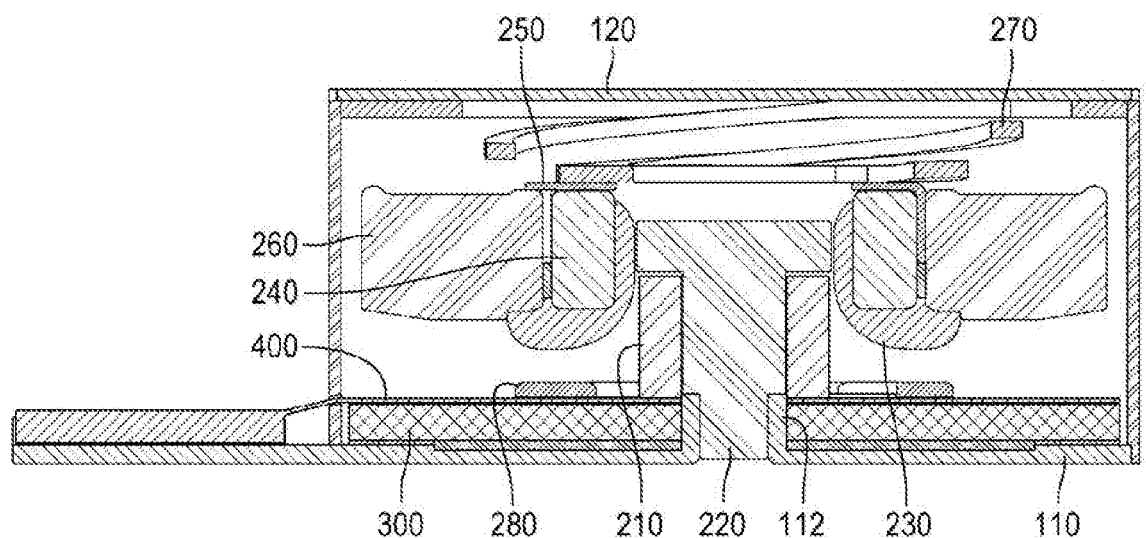
FIG. 8 is a sectional view showing a hybrid actuator according to a second embodiment of the present invention.

FIG. 8 is a sectional view showing a hybrid actuator according to a second embodiment of the present invention. The hybrid actuator of the second embodiment is the same as that of the first embodiment in terms of the shapes or arrangements of the components except the structure of the vibrator. In the hybrid actuator according to the second embodiment of the present invention, a magnetic fluid 230 is applied around the air gap. Preferably, the magnetic fluid 230 is applied on the inner circumferential surface of the permanent magnet 240, the bottom surface of the permanent magnet 240, and some of the bottom surface of the weight 260.

In the second embodiment of the present invention, the magnetic fluid 230 is applied on the vibrator, but it may be applied around the coil 210 or the pole piece 220 or the elastic member 280.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A hybrid actuator, comprising:
   a housing;
   a stator secured to the housing and having a coil;
   a vibrator having a permanent magnet configured to vibrate due to a mutual electromagnetic force with the stator;
   an elastic member configured to elastically support the vibrator relative to the housing;
   a piezoelectric element attached to one surface of the housing; and
   an F-PCB (flexible printed circuit board) applying an electric current to the piezoelectric element and the coil inside the housing,
   wherein a part of the F-PCB extends outside the housing,
   wherein input terminals are formed on the part of the F-PCB which extends outside the housing, the input terminals configured to receive a vibration signal and an audio signal so that the hybrid actuator can reproduce both the vibration signal and the audio signal.

2. The hybrid actuator of claim 1, wherein the F-PCB is disposed between the piezoelectric element and the coil.

3. The hybrid actuator of claim 1, wherein the piezoelectric element has a hole for use in assembly to the housing.

4. The hybrid actuator of claim 1, wherein the piezoelectric element has a bimorph structure.

5. The hybrid actuator of claim 1, wherein an electric contact between the piezoelectric element and the F-PCB is positioned further outside an outer diameter of the vibrator.

6. The hybrid actuator of claim 1, wherein the stator comprises a pole piece press-fit and secured to the housing, and wherein the coil is disposed around the pole piece.

7. The hybrid actuator of claim 6, wherein the pole piece comprises a first diameter portion press-fit into the housing, a second diameter portion around which the coil is disposed, and a third diameter portion positioned on the coil and having a larger diameter than the first diameter portion and the second diameter portion.

8. The hybrid actuator of claim 1, wherein there are two or more input terminals formed on the part of the F-PCB which extends outside the housing, and wherein an original signal level is input to the coil and the piezoelectric element or same source signals with different input levels are input to the coil and the piezoelectric element, respectively.

9. The hybrid actuator of claim 8, wherein, when reproducing the audio signal, the input level of the vibration signal frequency band is reproduced equal to or lower than the original signal level.

10. The hybrid actuator of claim 1, wherein the stator or the vibrator comprises a magnetic fluid applied around an air gap.

11. The hybrid actuator of claim 1, further comprising an elastic member disposed on a top surface of the F-PCB to relieve a touching impact of the vibrator.

* * * * *